(12) United States Patent
Umetsu et al.

(10) Patent No.: US 11,417,831 B2
(45) Date of Patent: Aug. 16, 2022

(54) MAGNETIC MEMORY

(71) Applicant: KIOXIA CORPORATION, Tokyo (JP)

(72) Inventors: Nobuyuki Umetsu, Kawasaki Kanagawa (JP); Tsuyoshi Kondo, Kawasaki Kanagawa (JP); Masaki Kado, Kamakura Kanagawa (JP); Shiho Nakamura, Fujisawa Kanagawa (JP); Susumu Hashimoto, Tokyo (JP); Yasuaki Ootera, Yokohama Kanagawa (JP); Michael Arnaud Quinsat, Yokohama Kanagawa (JP); Masahiro Koike, Tokyo (JP); Tsutomu Nakanishi, Yokohama Kanagawa (JP); Megumi Yakabe, Kawasaki Kanagawa (JP); Agung Setiadi, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 68 days.

(21) Appl. No.: 16/538,974

(22) Filed: Aug. 13, 2019

(65) Prior Publication Data
US 2020/0303624 A1    Sep. 24, 2020

(30) Foreign Application Priority Data
Mar. 19, 2019  (JP) .............................. JP2019-051923

(51) Int. Cl.
*H01L 27/22* (2006.01)
*H01L 43/02* (2006.01)
(Continued)

(52) U.S. Cl.
CPC ............ *H01L 43/02* (2013.01); *G11C 11/161* (2013.01); *H01L 27/222* (2013.01); *H01L 43/08* (2013.01); *H01L 43/10* (2013.01)

(58) Field of Classification Search
CPC ......... H01L 29/82; H01L 43/02; H01L 43/10; H01L 43/08; H01L 27/222; H01F 10/03;
(Continued)

(56) References Cited

U.S. PATENT DOCUMENTS 9,293,696 B2    3/2016   Ootera et al.
9,831,423 B2    11/2017  Kondo et al.
(Continued)

FOREIGN PATENT DOCUMENTS

JP    2017-59593        3/2017
JP    2017-59595 A      3/2017
(Continued)

*Primary Examiner* — Samuel Park
(74) *Attorney, Agent, or Firm* — Finnegan, Henderson, Farabow, Garrett & Dunner L.L.P.

(57) ABSTRACT

A magnetic memory according to an embodiment includes: a magnetic member including a first to third magnetic parts, the first magnetic part including a first portion and a second portion and extending in a first direction from the first portion to the second portion, the second magnetic part extending in a second direction that crosses the first direction, and the third magnetic part connecting the second magnetic part and the first portion; a first nonmagnetic metal layer arranged along the third magnetic part, the first nonmagnetic metal layer including a first end portion on a side of the second portion, a position of the first end portion along the first direction being between positions of the first and second portions along the first direction; and a first and second electrodes supplying a current between the first and second magnetic parts via the third magnetic part.

10 Claims, 6 Drawing Sheets

(51) Int. Cl.
*G11C 11/16* (2006.01)
*H01L 43/10* (2006.01)
*H01L 43/08* (2006.01)

(58) Field of Classification Search
CPC . H01F 41/306; G11C 11/161; G11C 11/1675; G11C 19/0841; G11C 19/0808
See application file for complete search history.

(56) References Cited

U.S. PATENT DOCUMENTS

| | | |
|---|---|---|
| 10,020,039 B2 | 7/2018 | Fukami et al. |
| 10,084,126 B1 | 9/2018 | Quinsat et al. |
| 2013/0058156 A1* | 3/2013 | Ohno ............... H01L 43/08 365/158 |
| 2015/0380638 A1* | 12/2015 | Ootera ............. G11C 11/1675 257/421 |
| 2016/0155778 A1* | 6/2016 | Shimada ............. H01L 43/12 257/252 |

FOREIGN PATENT DOCUMENTS

| | | |
|---|---|---|
| JP | 6271350 B2 | 1/2018 |
| JP | 2018-157019 | 10/2018 |
| JP | 6414754 B2 | 10/2018 |
| WO | WO 2015/068509 A1 | 5/2015 |

\* cited by examiner

MAGNETIC MEMORY

CROSS REFERENCE TO RELATED APPLICATIONS

This application is based upon and claims the benefit of priority from the prior Japanese Patent Application No. 2019-051923, filed on Mar. 19, 2019, the entire contents of which are incorporated herein by reference.

FIELD

Embodiments described herein relate generally to magnetic memories.

BACKGROUND

A magnetic memory is known, in which domain walls of a magnetic material are moved (shifted) due to a current caused to flow through the magnetic material. In such a magnetic memory, a first electrode is electrically connected to one terminal of the magnetic part, and a second electrode is connected to the other terminal. The domain walls are moved when a shift current flows between the first electrode and the second electrode. The magnetic memory further includes a magnetic layer disposed between the one terminal of the magnetic part and the first electrode, and connected to the one terminal. A read element (for example, a magnetic tunnel junction (MTJ) element) for reading information (magnetization direction) from the magnetic layer is disposed in a region that is close to the magnetic layer. The magnetic memory further includes a write portion (for example, a field line) for writing information to the magnetic layer.

The magnetic memory having such a configuration has a problem in that the shift current may become large.

DETAILED DESCRIPTION

A magnetic memory according to an embodiment includes: a magnetic member including a first magnetic part, a second magnetic part, and a third magnetic part, the first magnetic part including a first portion and a second portion and extending in a first direction from the first portion to the second portion, the second magnetic part extending in a second direction that crosses the first direction, and the third magnetic part connecting the second magnetic part and the first portion; a first nonmagnetic metal layer arranged along the third magnetic part, the first nonmagnetic metal layer including a first end portion on a side of the second portion, a position of the first end portion along the first direction being between a position of the first portion along the first direction and a position of the second portion along the first direction; and a first electrode and a second electrode that supply a current between the first magnetic part and the second magnetic part via the third magnetic part.

First Embodiment

Figure 1A:
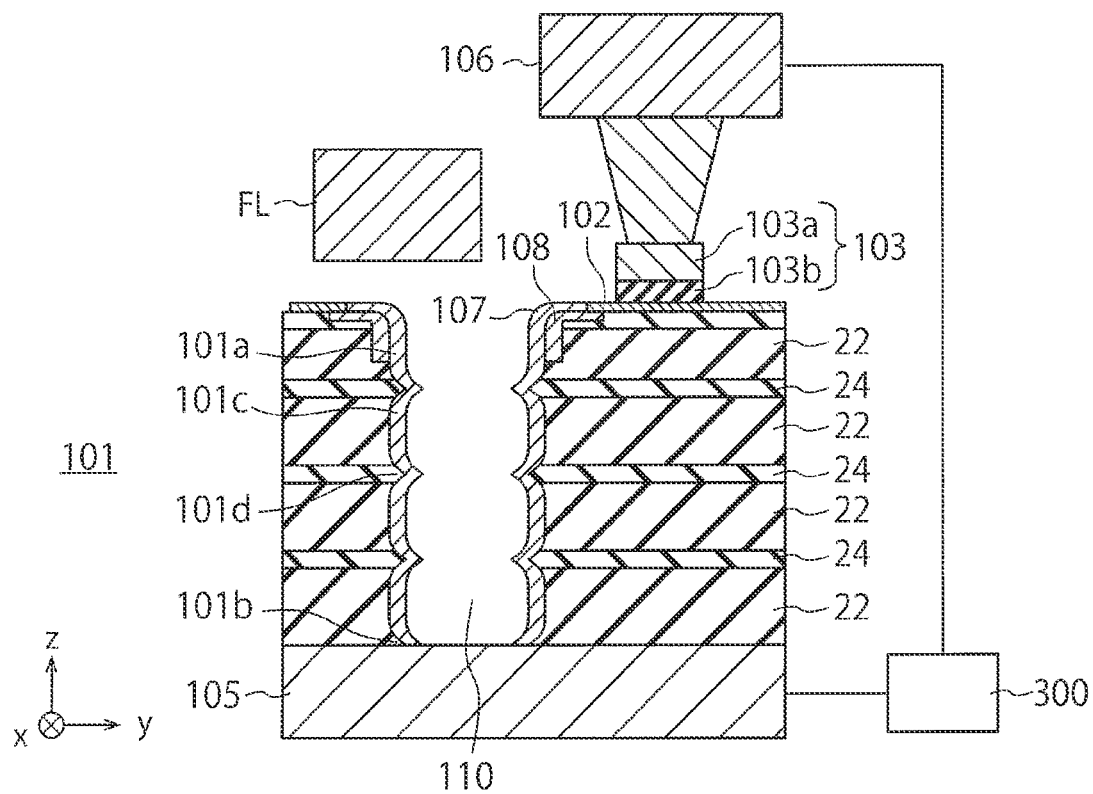
FIG. 1A is a cross-sectional view of a magnetic memory according to a first embodiment.
Figure 1B:
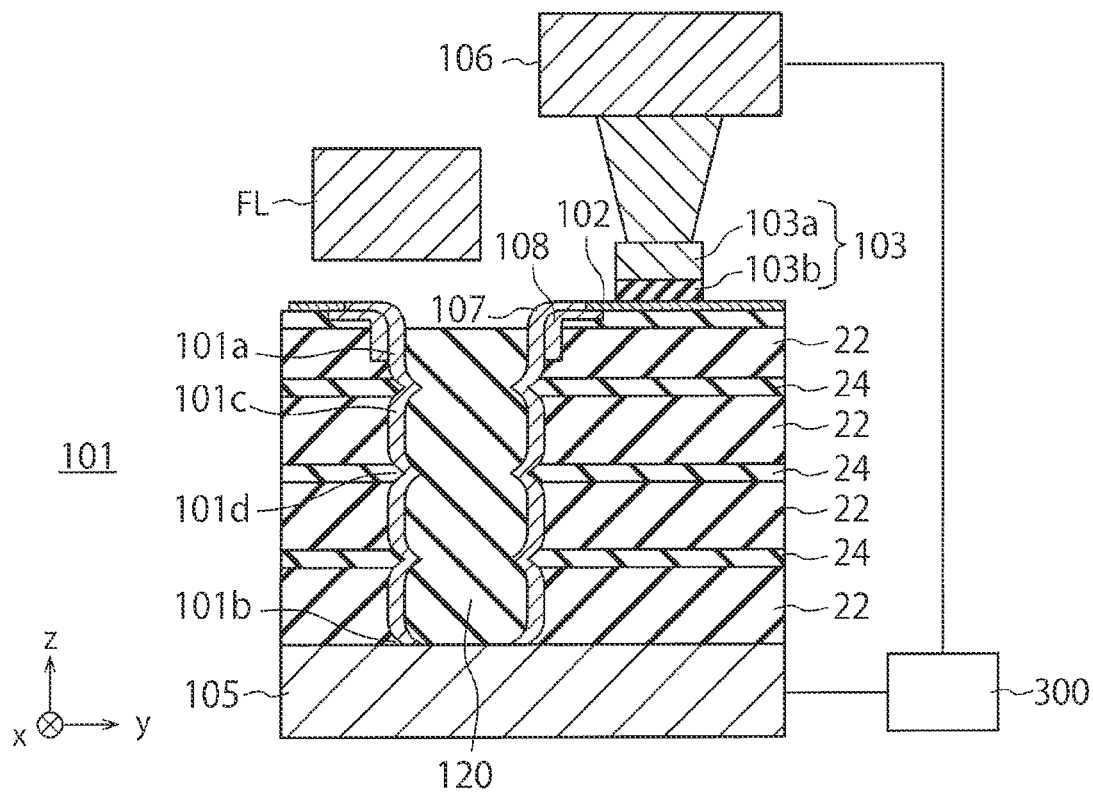
FIG. 1B is a cross-sectional view of a magnetic memory according to a modification of the first embodiment.

FIG. 1A shows a magnetic memory according to a first embodiment. The magnetic memory according to the first embodiment includes a magnetic member that includes a first magnetic part 101 having a cylindrical shape with a hollow portion 110, a second magnetic part 102, and a third magnetic part (connection part) 107 connecting the first magnetic part 101 and the second magnetic part 102. The magnetic memory further includes a conductive layer (nonmagnetic metal layer) 108 that is capable of generating a spin-orbit-torque (SOT) in the third magnetic part 107. The first magnetic part 101 extends in a z direction (upward in FIG. 1). The first magnetic part 101 is formed of a perpendicular magnetization material. Therefore, the easy magnetization axis of the first magnetic part 101 is in a plane that is perpendicular to the z direction (first direction). The hollow portion 110 may be filled with a nonmagnetic insulating material (such as silicon oxide, silicon nitride, or alumina) 120 as shown in FIG. 1B. In other words, the first magnetic part 101 may be disposed to surround the nonmagnetic insulating material 120.

The first magnetic part 101 includes a first portion (end portion) 101a and a second portion (end portion) 101b. One end of the second magnetic part 102 is connected to the first portion 101a of the first magnetic part 101. The second magnetic part 102 is disposed to surround the end portion 101a. A magnetoresistive element (for example, a magnetic tunnel junction (MTJ) element) 103 is disposed on the second magnetic part 102. An electrode 106 is electrically connected to a surface of the magnetoresistive element 103 opposite to the second magnetic part 102, i.e., the top surface of the magnetoresistive element 103. An electrode 105 is electrically connected to the end portion 101b of the first magnetic part 101. The phrase "A and B are electrically connected" herein means that A and B may be directly connected or that A and B may be indirectly connected with a conductive material disposed between A and B. The outer shape of a cross section of the first magnetic part 101 taken along a plane that is perpendicular to the z direction is set to be circular, oval, or polygonal.

The magnetoresistive element 103 includes a magnetization fixed layer 103a in which the magnetization is fixed, the magnetization fixed layer 103a being disposed to face at least part of the second magnetic part 102, and a nonmagnetic layer 103b disposed between the magnetization fixed layer 103a and the at least portion of the second magnetic part 102. A field line (wiring line) FL is disposed near a first portion of the second magnetic part 102 that is opposite to a second portion of the second magnetic part 102 where the magnetoresistive element 103 is disposed. The hollow portion 110 is disposed between the first portion of the second magnetic part 102 and the second portion of the second magnetic part 102. Information (magnetization direction) is written to the first magnetic part 101 by causing a current to flow through the field line FL to generate a magnetic field, and writing information (magnetization direction) to the second magnetic part 102, which is near the field line FL, by using the magnetic field. Therefore, the field line FL is disposed in a region separated from the second magnetic part 102 by a distance that allows the field line FL to perform a write operation using the magnetic field generated by the aforementioned current.

A read operation is performed by causing a current to flow between the electrode 105 and the electrode 106 via the magnetoresistive element 103 by means of a circuit 300.

The first magnetic part 101 includes a plurality of regions (fifth portions) 101c arranged in the z direction. The regions 101c are separated from one another by narrow portions (sixth portions) 101d disposed on an outer surface of the first magnetic part 101. The regions 101c have at least one magnetic domain. When the circuit 300 supplies a drive current (shift current) between the electrode 106 and the electrode 105, the domain walls in the first magnetic part 101 are moved (shifted) in the z direction due to spin transfer torque. If no drive current is supplied, the domain walls stay at the narrow portions 101d. The outer diameter of each of the regions 101c sectioned by a first plane that is perpendicular to the z direction is greater than the outer diameter of each of the narrow portions 101d sectioned by a second plane that is perpendicular to the z direction. The cross-sectional area of each of the regions 101c sectioned by the first plane that is perpendicular to the z direction is greater than the cross-sectional area of each of the narrow portions 101d sectioned by the second plane that is perpendicular to the z direction.

In this magnetic memory, an insulating film 22 is disposed on a side of the region 101c that is opposite to the hollow portion 110 in a y direction (lateral direction in FIG. 1), and an insulating film 24 is disposed on a side of the narrow portion 101d that is opposite to the hollow portion 110. Therefore, the region 101c is disposed between the hollow portion 110 and the insulating film 22, and the narrow portion 101d is disposed between the hollow portion 110 and the insulating film 24. An x direction, which will be described later, is a direction that is perpendicular to the z direction and the y direction.

The conductive layer (nonmagnetic metal layer) 108 that is capable of generating SOT is disposed between the third magnetic part 107, which is between the first magnetic part 101 and the second magnetic part 102, and the insulating film 22 and the insulating film 24.

The first magnetic part 101 and the third magnetic part 107 are multilayer films including such materials as cobalt and nickel. In addition to cobalt and nickel, an alloy including an element selected from iron, cobalt, platinum, palladium, magnesium, and a rare earth element may also be used as the material of the first magnetic part 101 and the third magnetic part 107. The second magnetic part 102 contains a magnetic element such as iron or cobalt.

The nonmagnetic metal layer 108 is formed of a material such as hafnium, tantalum, tungsten, rhenium, osmium, iridium, platinum, or gold.

Information (magnetization direction) is written to the first magnetic part 101 by flowing a current through the field line FL that is near the second magnetic part 102 to write the information to the second magnetic part 102. The information is read by causing a current to flow between the electrode 105 and the electrode 106 via the magnetoresistive element 103.

Figure 2:
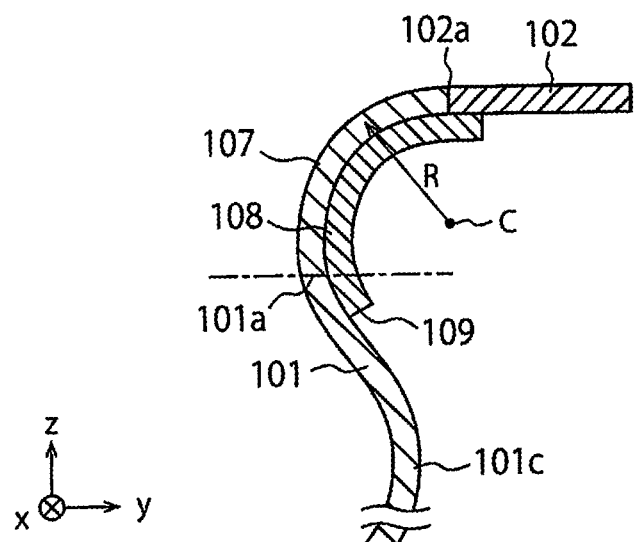
FIG. 2 is a cross-sectional view showing an example in which a third magnetic part connects an end portion of a first magnetic part and a second magnetic part in the magnetic memory according to the first embodiment.

In the magnetic memory according to the first embodiment, the end portion 101a of the first magnetic part 101 and an end portion 102a of the second magnetic part 102 are connected to each other with the third magnetic part 107 disposed therebetween, as shown in the cross-sectional view of FIG. 2. The third magnetic part 107 is formed of a magnetic material, and has a curved shape with a large radius of curvature R, which is preferably 10 nm or more, for example. The nonmagnetic metal layer (conductive layer) 108 capable of generating SOT is disposed along the curved shape of the third magnetic part 107 on the side where the center of curvature C of the radius of curvature R concerning the third magnetic part 107 is present. The nonmagnetic metal layer 108 may extend immediately below the second magnetic part 102, or the region 101c near the end portion 101a of the first magnetic part 101, or the narrow portion 101d. Thus, the nonmagnetic metal layer 108 is disposed near the third magnetic part 107.

The magnetic memory having such a configuration is formed by alternately laminating two kinds of insulating films 22 and 24 having different etching rates to form a laminate structure, and then forming the hollow portion 110 in the laminate structure. If the material of the insulating film 22 has a higher etching rate than the material of the insulating film 24, for example, the insulating film 22 is etched faster than the insulating film 24 when the hollow portion 110 is being formed. The etched portion of the insulating film 22 becomes a recess, and the etched portion of the insulating film 24 becomes a protrusion. Therefore, the side portion of the hollow portion 110 has protrusions and recesses. The corner portion of the uppermost insulating film facing the hollow portion is then rounded. The nonmagnetic metal layer 108 is disposed near the rounded corner portion. Thereafter, a magnetic material is disposed on the side of the hollow portion 110, the nonmagnetic metal layer 108, and the uppermost insulating film. This results in the formation of the second magnetic part 102 on the uppermost insulating film, the third magnetic part 107 on the nonmagnetic metal layer 108, and the first magnetic part 101 on the side of the hollow portion 110.

As described above, in the magnetic memory according to the first embodiment, the third magnetic part 107 having a curved shape is disposed between the second magnetic part 102 and the end portion 101a of the first magnetic part 101, and the nonmagnetic metal layer 108 capable of generating SOT is disposed along the third magnetic part 107. The nonmagnetic metal layer 108 does not cover the entire length of the first magnetic part 101 in the z axis direction. Specifically, the nonmagnetic metal layer 108 has an end portion 109 disposed on the end portion 101b side of the first magnetic part 101. The end portion 109 is located between a point of the end portion 101a of the first magnetic part 101 that is set along the z direction (for example, a position connecting the first magnetic part 101 and the third magnetic part 107) and a position of the end portion 101b of the first magnetic part 101 that is set along the z direction (for example, an intermediate position, when viewed in the z direction, of the region 101c or the narrow portion 101d, which is the closest to the end portion 101b).

Figure 3:
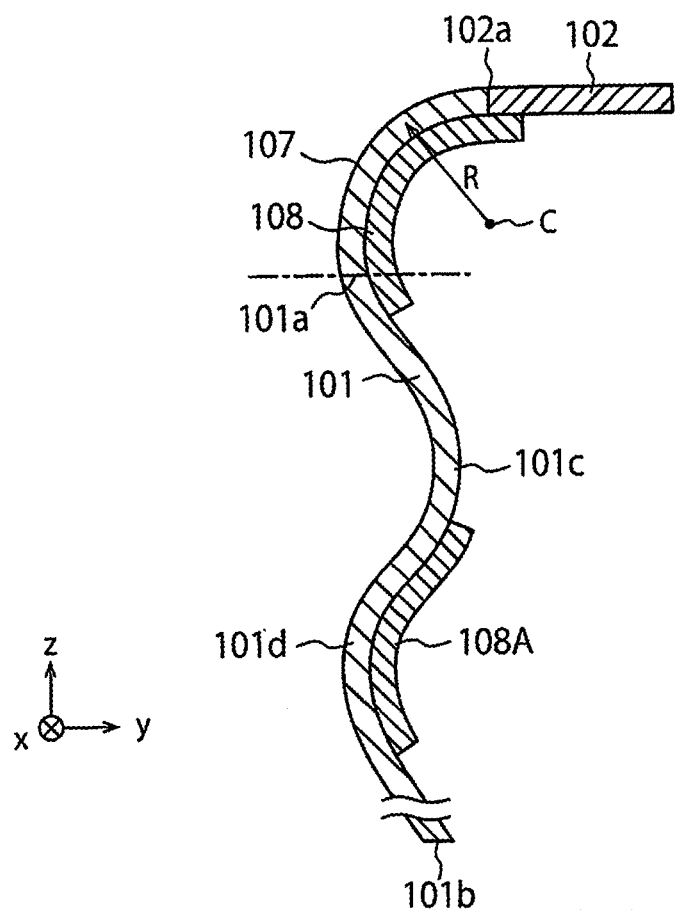
FIG. 3 is a cross-sectional view illustrating the arrangement of a magnetic part and a nonmagnetic metal layer in a magnetic memory according to another modification of the first embodiment.

In the first embodiment, the nonmagnetic metal layer 108 is disposed along the third magnetic part 107. However, as in a modification of the first embodiment shown in FIG. 3, the nonmagnetic metal layer 108 may include a nonmagnetic metal layer 108A disposed along the region 101c or the narrow portion 101d that is distant from the end portion 101a of the first magnetic part 101, in addition to the part disposed along the third magnetic part 107.

Comparative Example

Figure 4:
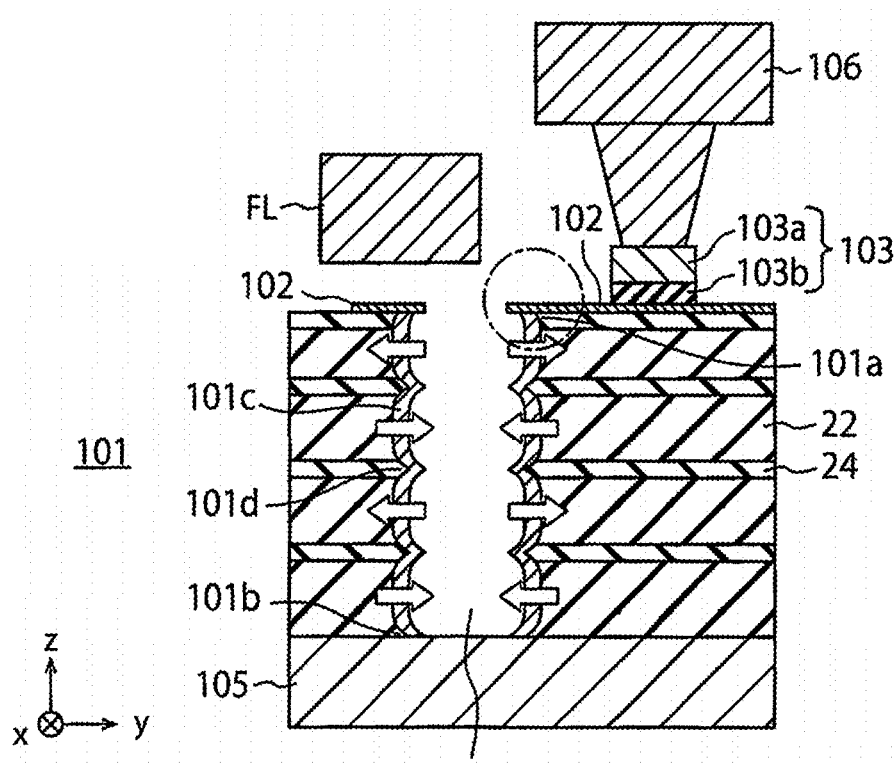
FIG. 4 is a cross-sectional view of a magnetic memory according to a comparative example.

FIG. 4 shows a magnetic memory according to a comparative example. The magnetic memory according to the comparative example differs from the magnetic memory according to the first embodiment shown in FIG. 1A in that the shape of the connection portion connecting the end portion 101a of the first magnetic part 101 and the second magnetic part 102 is different, and that the nonmagnetic metal layer 108 is not disposed. In the connection portion of the magnetic memory according to the comparative example, the second magnetic part 102 is simply connected to the end portion 101a of the first magnetic part 101, and therefore does not have a smooth, curved shape, unlike the connection portion (third magnetic part 107) of the first embodiment.

Figure 5:
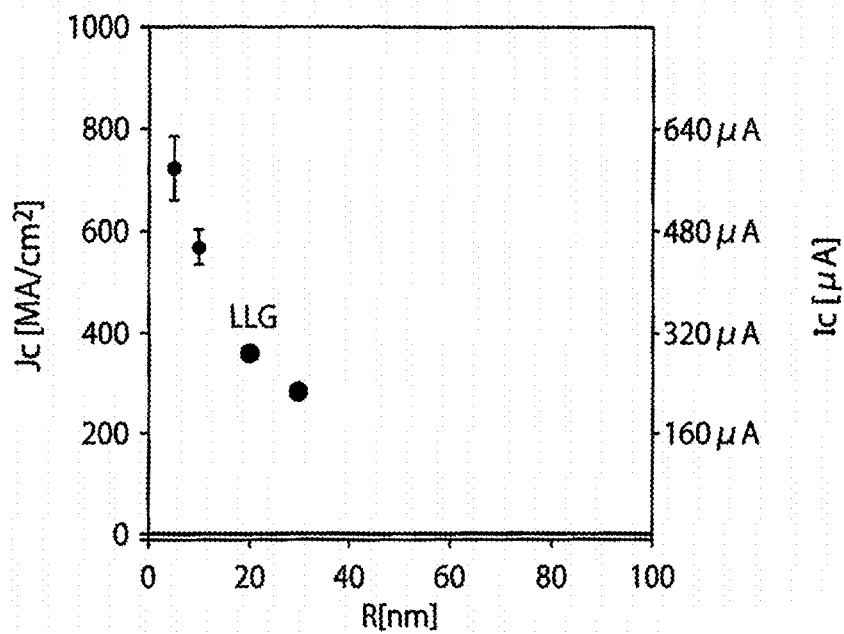
FIG. 5 is a diagram showing a result of a simulation of domain wall shift current Ic obtained by using the LLG equation in the magnetic memory according to the comparative example.

FIG. 5 shows a result of a simulation for obtaining a domain wall shift current Ic by using the Landau-Lifshitz-Gilbert (LLG) equation when the radius of curvature R of the third magnetic part between the second magnetic part 102 and the end portion 101a of the first magnetic part 101 is 5 nm, 10 nm, 20 nm, or 30 nm in the magnetic memory according to the comparative example. The simulation is performed on the second magnetic part 102 and the first magnetic part 101, which are two dimensional in the y-z plane. The thickness in the x direction of each portion is 40 nm. In FIG. 5, the horizontal axis indicates the radius of curvature R (nm), and the vertical axis indicates the current density Jc (MA/cm$^2$) when the domain walls are being shifted. In the simulation, the thickness of the first magnetic part (the length in the y direction) is set to be 2 nm and the width (the length in the x direction) is set to be 40 nm, the length in the y direction of the second magnetic part 102 is set to be 160 nm, and the length in the z direction of the first magnetic part 101 is set to be 160 nm. The shift current Ic with respect to each radius of curvature R can be calculated from the current density Jc. For example, the shift current Ic when the current density Jc is 800 MA/cm$^2$, 600 MA/cm$^2$, 400 MA/cm$^2$, and 200 MA/cm$^2$ is 640 µA, 480 µA, 320 µA, and 160 µA, respectively. Therefore, if R is 5 nm, the shift current Ic is about 580 µA. If R is 10 nm, the shift current Ic is about 460 µA. If R is 20 nm, the shift current Ic is about 280 µA. If R is 30 nm, the shift current Ic is about 220 µA. The solid line in FIG. 5 indicates the current density Jc obtained by the simulation for the case where R is infinite, i.e., there is no curved portion between the second magnetic part 102 and the first magnetic part 101. As can be understood from FIG. 5, the shift current increases considerably as compared to the case where there is no curved portion between the second magnetic part 102 and the first magnetic part 101. It can be understood therefore that a large shift current is required to shift the domain walls by spin transfer torque (STT).

Figure 6:
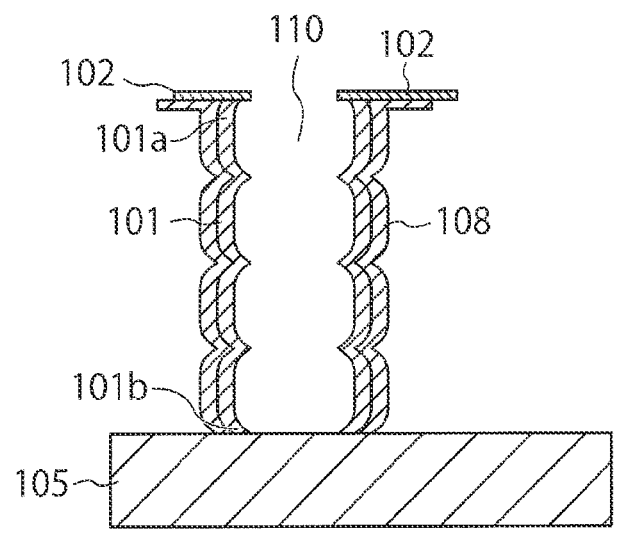
FIG. 6 is a cross-sectional view of a magnetic memory according to another comparative example in which a nonmagnetic metal layer is uniformly arranged between a first magnetic part and insulating films.

FIG. 6 shows an example of a magnetic memory using spin orbit torque (SOT) in addition to the spin transfer torque (STT) in the magnetic memory according to the comparative example. This magnetic memory has a configuration obtained by disposing a conductive layer (nonmagnetic metal layer) 108 having a uniform thickness and capable of generating SOT between the second magnetic part 102 and the insulating film 22 (insulating film 24), between the first magnetic part 101 and the insulating film 22, and between the first magnetic part 101 and the insulating film 24 in the magnetic memory according to the comparative example shown in FIG. 4. In FIG. 6, the insulating film 22 and insulating film 24 are not shown.

Figure 7:
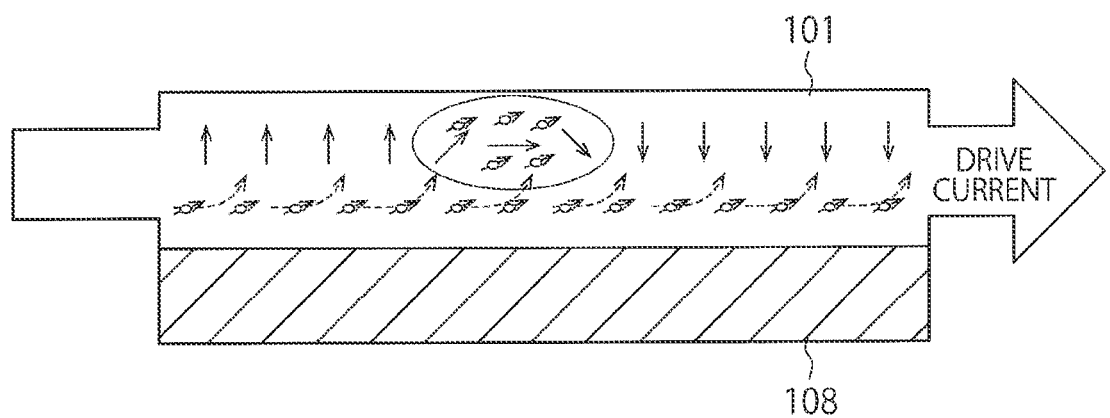
FIG. 7 is a diagram illustrating that the movement of domain walls is assisted by a spin current flowing through the nonmagnetic metal layer in the magnetic memory shown in FIG. 6.

If a shift current for shifting the domain walls flows between the electrode 106 and the electrode 105 in the magnetic memory shown in FIG. 6, the shift current flows through the first magnetic part 101 and the nonmagnetic metal layer 108. As shown in FIG. 7, the shift current caused by spin transfer torque flows through the first magnetic part 101. Furthermore, a spin current is generated in the nonmagnetic metal layer 108, which applies SOT on the spin of the electrons in the first magnetic part 101, thereby generating a drive current for shifting the domain walls.

However, since the nonmagnetic metal layer 108 is disposed over the entire length of the first magnetic part 101 in the magnetic memory shown in FIG. 6, the shifting speed of the domain walls in the first magnetic part 101 is greater than that in the case where no nonmagnetic metal layer 108 is disposed. As a result, the domain walls may be congested in the third magnetic part between the second magnetic part 102 and the first magnetic part 101, and may disappear.

In contrast, in the magnetic memory according to the first embodiment, the third magnetic part 107 having a curved shape is disposed between the second magnetic part 102 and the end portion 101a of the first magnetic part 101, and the nonmagnetic metal layer 108 capable of generating SOT is disposed near the third magnetic part 107. The nonmagnetic metal layer 108 is not disposed over the entire length of the first magnetic part 101 along the z axis direction. Therefore, the shift current for shifting the domain walls, which flows through the first magnetic part 101, is assisted by the spin current generated in the nonmagnetic metal layer 108. As a result, the domain walls are not congested in the third magnetic part 107 and domain wall pass through the third magnetic part 107 smoothly. Therefore, the increase in the shift current may be prevented.

As described above, the magnetic memory according to the first embodiment and its modification are capable of preventing an increase in shift current.

Second Embodiment

Figure 8:
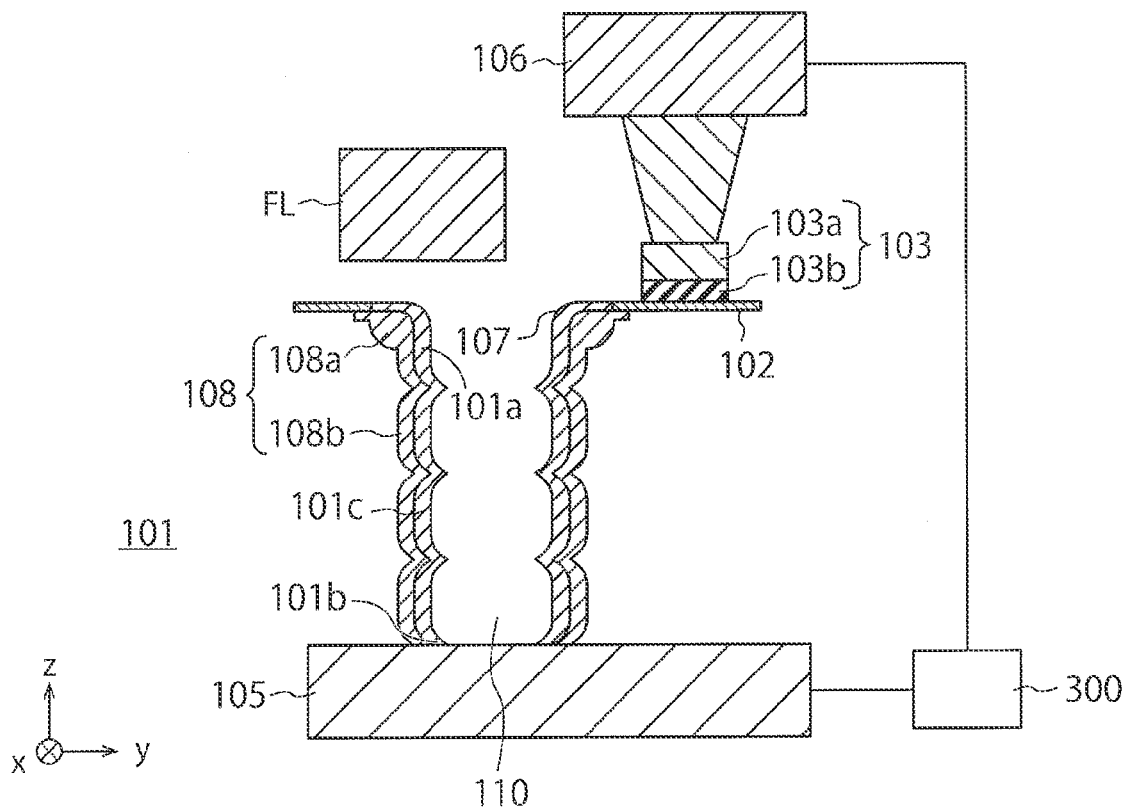
FIG. 8 is a cross-sectional view of a magnetic memory according to a second embodiment.

FIG. 8 illustrates a magnetic memory according to a second embodiment. The magnetic memory according to the second embodiment differs from the magnetic memory of the first embodiment shown in FIG. 1A in the position and the thickness of the nonmagnetic metal layer 108. A portion 108b of the nonmagnetic metal layer 108 is disposed on the outer surface of the first magnetic part 101. A portion 108a of the nonmagnetic metal layer 108 is disposed along the third magnetic part 107 connecting the end portion 101a of the first magnetic part 101 and the second magnetic part 102. The thickness of the portion 108a in the y direction is greater than the thickness of the portion 108b in the y direction disposed on the outer surface of the first magnetic part 101. The portion 108a is formed of a material capable of generating SOT. The third magnetic part 107 is in the same shape as the third magnetic part 107 of the first embodiment shown in FIG. 2. Thus, in the second embodiment, the ratio between the thickness of the portion 108*a* of the nonmagnetic metal layer 108 disposed along the third magnetic part 107 and the thickness of the third magnetic part 107 in the y direction is greater than the ratio between the thickness of the portion 108*b* of the nonmagnetic metal layer 108 and the thickness of the third magnetic part 107 in the y direction.

In the second embodiment having the above-described configuration, the nonmagnetic metal layer 108*b* is uniformly disposed over the outer surface of the first magnetic part 101. Therefore, the speed of the movement (shift) of the domain walls is accelerated in the first magnetic part 101. However, since the thickness of the portion 108*a* of the nonmagnetic metal layer 108 disposed along the third magnetic part 107 is increased in the second embodiment, the speed of the movement of the domain walls in the third magnetic part 107 is also accelerated. Therefore, the difference in domain wall moving speed between the first magnetic part 101 and the third magnetic part 107 may be eliminated. This improves the controllability with respect of the movement of the domain walls as compared with the magnetic memory shown in FIG. 6. Thus, the increase in shift current may be curbed.

As described above, the magnetic memory according to the second embodiment is capable of suppressing an increase in the shift current.

Figure 9:
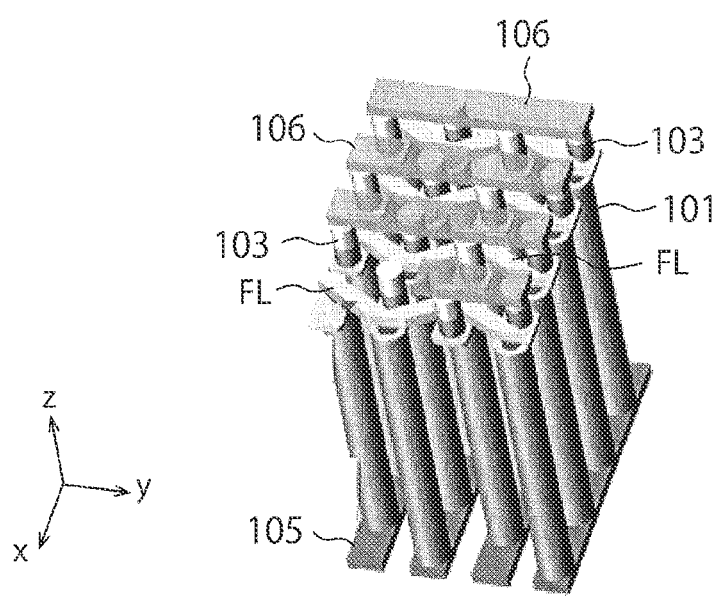
FIG. 9 is a perspective view of the magnetic memory according to each of the embodiments.
Figure 10:
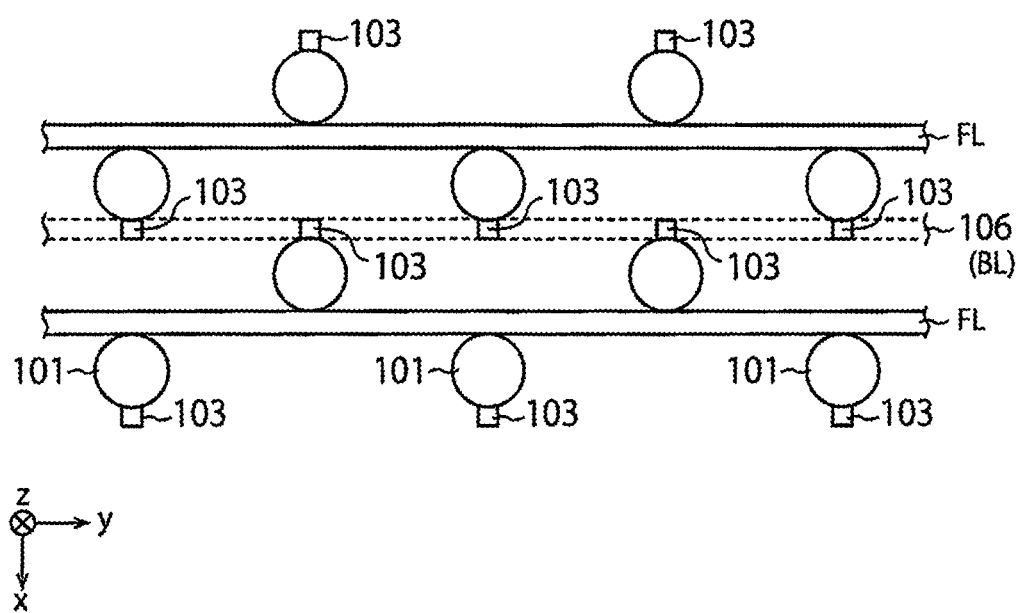
FIG. 10 is a diagram illustrating the arrangement of magnetic parts of the magnetic memory shown in FIG. 9.

In the above descriptions of the magnetic memories according to the first embodiment, its modification, and the second embodiment, there is only one first magnetic part 101. However, as shown in FIG. 9, the magnetic memories may include a plurality of first magnetic parts 101 arranged in an array form on the x-y plane. In the magnetic memory shown in FIG. 9, the first magnetic parts 101 are arranged on the x-y plane and have a hexagonal close-packed structure (planar structure). Specifically, each of the first magnetic parts 101 arranged in one row (in the y direction) is between two adjacent first magnetic parts 101 arranged in the next row (in the y direction), and each of the first magnetic parts 101 arranged in one column (in the x direction) is between two adjacent first magnetic parts 101 arranged in the next column (in the x direction) (FIG. 10). The first magnetic parts 101 arranged in the same column in the x direction share one electrode 105 (FIG. 9).

Each of the first magnetic parts 101 has the magnetoresistive element 103. As shown in FIG. 10, one field line FL is shared by the first magnetic parts 101 arranged in one row and the first magnetic parts 101 arranged in the next row. For example, the first magnetic parts 101 arranged in the first row and the first magnetic parts 101 arranged in the second row share one field line FL, and the first magnetic parts 101 arranged in the third row and the first magnetic parts 101 arranged in the fourth row share another field line FL, as shown in FIG. 10. Therefore, the magnetoresistive element 103 is provided to the upper side of each of the first magnetic parts 101 arranged in the first row and the third row, and to the lower side of each of the first magnetic parts 101 arranged in the second row and the fourth row in FIG. 10.

Furthermore, as can be understood from FIG. 9, the first magnetic parts 101 arranged in one row and the first magnetic parts 101 arranged in an adjacent row are connected to the same wiring line (bit line BL) 106 via the corresponding magnetoresistive elements 103. For example, the first magnetic parts 101 arranged in the second row and the first magnetic parts 101 arranged in the third row are connected to the wiring line (bit line) 106 via the corresponding magnetoresistive elements 103 as shown in FIG. 10.

As described above, the magnetic memories according to the respective embodiments and their modifications are capable of suppressing an increase in shift current.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a first magnetic member including a first magnetic part, a second magnetic part, and a curved magnetic part,
the first magnetic part including a first portion and a second portion and extending in a first direction from the first portion to the second portion, the second magnetic part extending in a second direction that is perpendicular to the first direction, and the curved magnetic part connecting the second magnetic part and the first portion, and
the curved magnetic part including a first portion and a second portion, the first portion of the curved magnetic part extending in the first direction and the second portion of the curved magnetic part extending in the second direction;
a first nonmagnetic layer including a first portion disposed along the curved magnetic part, a side surface of the first portion having a convex shape that faces away from the curved magnetic part,
wherein the convex shape is located at an interface between the first portion of the curved magnetic part and the second portion of the curved magnetic part; and
a first electrode and a second electrode that supply a current between the first magnetic part and the second magnetic part via the curved magnetic part.

2. The magnetic memory according to claim 1, wherein the first magnetic part has a cylindrical shape extending in the first direction.

3. The magnetic memory according to claim 2, wherein an outer periphery of a section perpendicular to the first direction of the cylindrical shape has circular, oval, or polygonal shape.

4. The magnetic memory according to claim 1, further comprising a nonmagnetic insulating material part extending in the first direction,
wherein the first magnetic part is arranged around the nonmagnetic insulating material part.

5. The magnetic memory according to claim 1, wherein the first nonmagnetic layer contains at least one selected from the group consisting of hafnium, tantalum, tungsten, rhenium, osmium, iridium, platinum, and gold.

6. The magnetic memory according to claim 1, wherein the first magnetic part has a plurality of third portions arranged in the first direction, and a plurality of fourth portions arranged in the first direction, one of the fourth portions being arranged between two of the third portions that are adjacent to each other in the first direction, and one of the third portions being arranged between two of the fourth portions that are adjacent to each other in the first direction, an outer diameter of a section of each of the third portions taken along a first plane that is perpendicular to the first direction is greater than an outer diameter of a section of each of the fourth portions taken along a second plane that is perpendicular to the first direction.

7. The magnetic memory according to claim 1, further comprising a second magnetic member arranged along at least a portion of the second magnetic part, and a second nonmagnetic layer arranged between the second magnetic member and at least the portion of the second magnetic part.

8. The magnetic memory according to claim 7, wherein the second electrode is electrically connected to the second magnetic member, and the first electrode is electrically connected to the second portion of the first magnetic part.

9. The magnetic memory according to claim 1, further comprising a field line for writing information to the second magnetic part.

10. The magnetic memory according to claim 1, wherein the first nonmagnetic layer includes an extended portion disposed along the first portion of the first magnetic part and connecting to the first portion of the first nonmagnetic layer.

\* \* \* \* \*